United States Patent
Rodriguez

(10) Patent No.: US 10,390,453 B2
(45) Date of Patent: Aug. 20, 2019

(54) CABLE CONNECTION SYSTEM

(71) Applicant: International Business Machines Corporation, Armonk, NY (US)

(72) Inventor: Jean-Michel Rodriguez, Montpellier (FR)

(73) Assignee: International Business Machines Corporation, Armonk, NY (US)

( * ) Notice: Subject to any disclaimer, the term of this patent is extended or adjusted under 35 U.S.C. 154(b) by 165 days.

(21) Appl. No.: 15/255,268

(22) Filed: Sep. 2, 2016

(65) Prior Publication Data

US 2017/0347482 A1    Nov. 30, 2017

Related U.S. Application Data

(63) Continuation-in-part of application No. 15/168,366, filed on May 31, 2016.

(51) Int. Cl.
*H05K 7/14* (2006.01)
*H01R 35/02* (2006.01)
*H02G 3/18* (2006.01)
*H01R 35/00* (2006.01)

(52) U.S. Cl.
CPC ............ *H05K 7/1492* (2013.01); *H01R 35/00* (2013.01); *H01R 35/02* (2013.01); *H02G 3/185* (2013.01); *H05K 7/1488* (2013.01); *H05K 7/1491* (2013.01)

(58) Field of Classification Search
CPC ........ H01R 13/22; H01R 35/00; H01R 35/02; H01R 35/025; H01R 35/04; H02G 3/185; H05K 7/1488; H05K 7/1491
See application file for complete search history.

(56) References Cited

U.S. PATENT DOCUMENTS

| | | | | |
|---|---|---|---|---|
| 1,815,741 A | * | 7/1931 | Richardson | H01R 25/006 174/484 |
| 1,872,298 A | * | 8/1932 | Kehoe | H01H 1/64 200/304 |
| 2,811,574 A | * | 10/1957 | Guerrero | H02G 3/185 174/484 |
| 3,965,629 A | * | 6/1976 | Pearson | H02G 3/22 52/220.8 |
| 4,387,949 A | * | 6/1983 | Haitmanek | H02G 3/16 174/485 |
| 6,011,221 A | | 1/2000 | Lecinski et al. | |

(Continued)

OTHER PUBLICATIONS ip.com, Method and Apparatus for Flexible Cable Management in DataCenter, IP.com No. IPCOM000241422D, IP.com Electronic Publication Date: Apr. 25, 2015, 28 pages.

(Continued)

*Primary Examiner* — Felix O Figueroa
(74) *Attorney, Agent, or Firm* — Schmeiser, Olsen & Watts, LLP; Mark Vallone

(57) ABSTRACT

A cable connection system and a method of using the cable connection system. The cable connection system includes a base and a tube enveloping electrical cabling. The cabling is electrically connected to base connectors of the base. The base is configured to be physically and electrically connected to a rack. The base is at a fixed distance from the tube and is rotated around a center axis of the tube by a first angle within an angular range encompassing from more than zero degrees to less than 360 degrees.

7 Claims, 8 Drawing Sheets

(56) References Cited

U.S. PATENT DOCUMENTS

| | | |
|---|---|---|
| 6,245,998 B1 | 6/2001 | Curry et al. |
| 8,472,198 B2 | 6/2013 | Peng et al. |
| 8,589,609 B2 | 11/2013 | Hilburn |
| 8,598,453 B2 * | 12/2013 | Hsiao .................... H02G 3/185 |
| | | 174/481 |
| 9,048,569 B2 * | 6/2015 | Chen .................... H01R 12/716 |
| 2006/0294280 A1 | 12/2006 | Chen et al. |
| 2007/0077800 A1 * | 4/2007 | Isaacks ............. H01R 13/6397 |
| | | 439/215 |

OTHER PUBLICATIONS

U.S. Appl. No. 15/168,366, filed May 31, 2016, Conf. No. 4218.
U.S. Appl. No. 16/364,586, filed Mar. 26, 2019.
U.S. Appl. No. 16/364,761, filed Mar. 26, 2019.

* cited by examiner

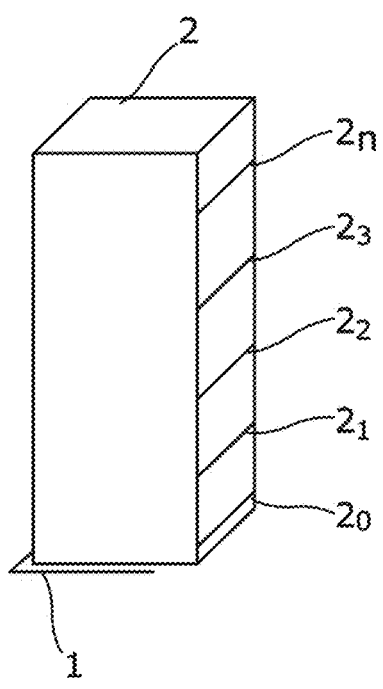
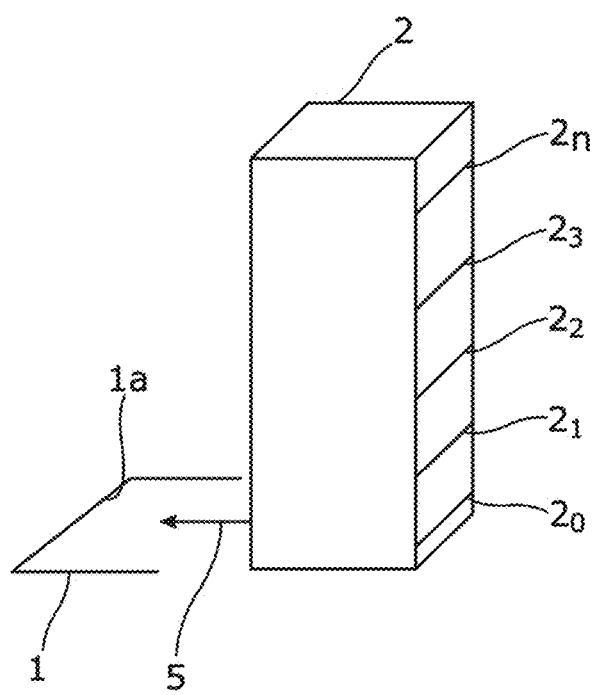
FIG. 2a
FIG. 2b

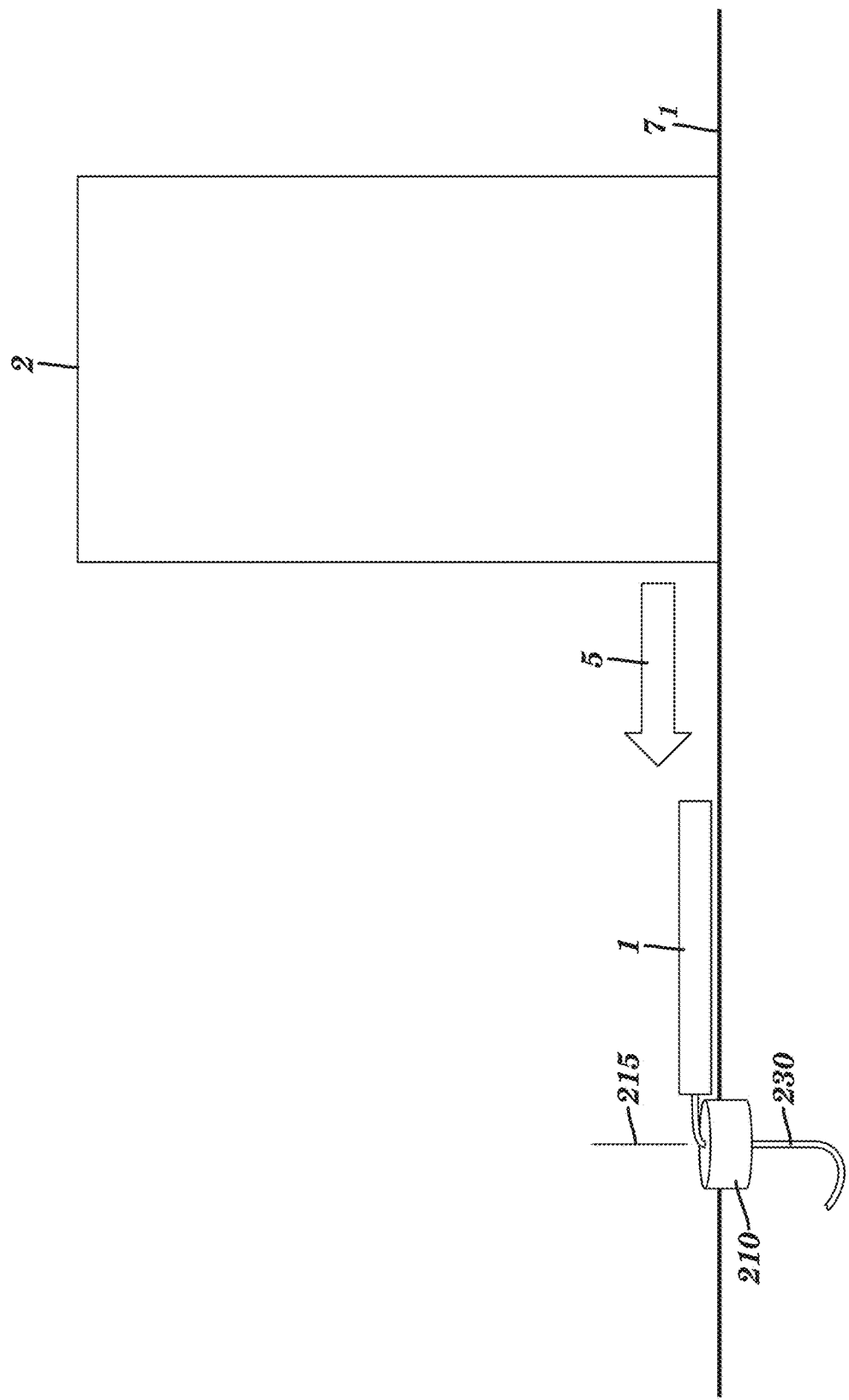

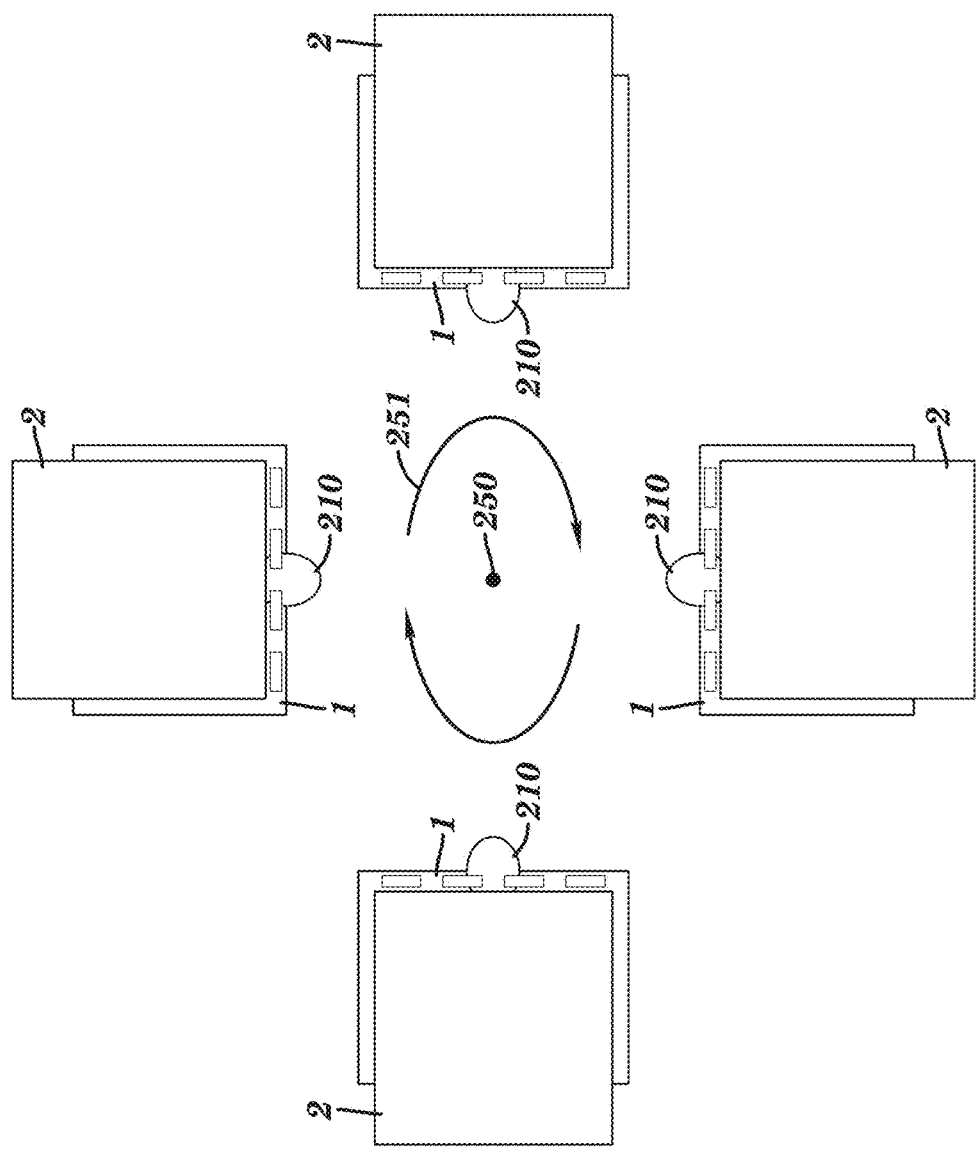

CABLE CONNECTION SYSTEM

This application is a continuation-in-part application claiming priority to Ser. No. 15/168,366, filed May 31, 2016 which is incorporated herein by reference in its entirety.

TECHNICAL FIELD

The present invention relates to a cable connection system and to a method for using the cable connection system.

BACKGROUND

In the context of information technology (IT), it may be desirable to provide network resources, such as, for example, multiple network servers in a given data center. Furthermore, it may be desirable to provide such network resources in a consolidated form and with regard to efficient and optimum usage of the available floor space in such a data center. In this regard, the network servers may be provided in a stack within a framework provided by an IT rack.

In typical data centers, multiple racks may be found. Each rack may comprise multiple network servers stacked relative to each other. Each rack is designed to comprise multiple slots, also referred to as bays. Each bay provides an allocated space for mounting at least a given network server. Fastening screws are provided for each bay for facilitating secured accommodation of a given network server within each bay.

Because multiple network servers may typically be mounted within a given rack, ventilation of the heat produced by any of the network servers operating within that given rack are to be considered. It may also be desirable to additionally provide mechanisms for cooling a given rack when the network servers mounted in the given rack are in use.

To connect a given rack, electrically or otherwise, either with respect to another given rack or to change such connections between the network servers housed in the given rack, both such scenarios hereinafter referred to generally as a rack connection, multiple cables and relatively complex cabling connections may be required. Thus, and particularly, in the event that the cabling format and/or configuration are to be changed for a given rack, performing the change(s) may be complicated and time-consuming and may, for example, even take days. Furthermore, mistakes in performing such connections may be inevitable due to the multiplicity of racks, cabling and/or network servers.

Accordingly, it is a challenge to perform rack connection with relative ease, time-efficiency and/or with reduced mistakes in cable connection.

SUMMARY

Embodiments of the present invention provide a cable connection system. The cable connection system includes a base and a tube enveloping electrical cabling. The cabling is electrically connected to base connectors of the base. The base is configured to be physically and electrically connected to a rack, wherein the base is at a fixed distance from the tube and is configured to rotate around a center axis of the tube over an angular range encompassing from more than zero degrees to less than 360 degrees.

Embodiments of the present invention provide a method of using a cable connection system. A base and a tube enveloping electrical cabling are provided. The cabling is electrically connected to base connectors of the base. The base is configured to be physically and electrically connected to a rack, wherein the base is at a fixed distance from the tube. The base is rotated around a center axis of the tube by a first angle within an angular range encompassing from more than zero degrees to less than 360 degrees.

BRIEF DESCRIPTION OF THE DRAWINGS

Reference will now be made, by way of example, to the accompanying drawings.

FIGS. 2a and 2b respectively illustrate a three-dimensional view of a connected mode and a disconnected mode of operation of a cable connection system, in accordance with embodiments of the present invention.

FIG. 6 illustrates the enveloped cabling within the tube of FIG. 5, in accordance with embodiments of the present invention.

FIG. 7 illustrates the tube of FIG. 5 rotating in a circular pattern around an axis of rotation, in accordance with embodiments of the present invention.

DETAILED DESCRIPTION

Figure 1:
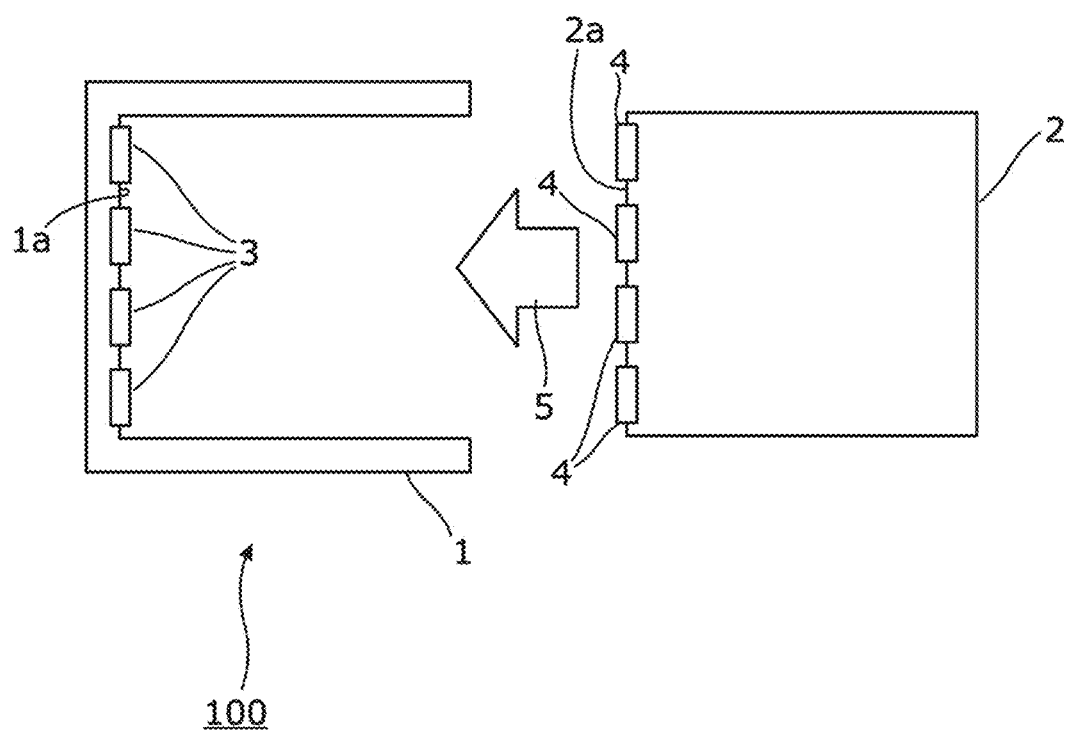
FIG. 1 illustrates a top view of a cable connection system that includes a base and a rack, in accordance with embodiments of the present invention.

Within the description, the same reference numerals or signs are used to denote the same parts or the like.

FIG. 1 illustrates a top view of a cable connection system 100 that includes a base 1 and a rack 2, in accordance with embodiments of the present invention. The cable connection system 100 may be used to facilitate cable connection with at least a given rack 2. The given rack 2 may comprise multiple electronic equipment units, such as, for example, respective computing units that may each be dedicated for use as a network server. Because the given rack 2 facilitates a framework to provide network servers in a stacked configuration, network resources may be pooled and stored with relative efficiency in a given space. This makes such racks 2 attractive for use in IT data centers, where a multiplicity of racks may typically be found.

As seen from FIG. 1, the cable connection system 100 according to an embodiment of the present invention comprises at least a base 1. The base 1 is configured to be coupled to any given cable that is to be connected to the given rack 2. Such a given cable may comprise a cable for connection of the given rack 2 to resources such as, for example, power, network, storage and so forth. The given cable may comprise copper or electrically conductive fiber, for example.

Also provided is a coupling mechanism 3, 4 that is configured to couple the base 1 to the given rack 2 in a given connect mode of operation of the cable connection system 100 according to an embodiment of the present invention. The coupling mechanism 3, 4 comprises at least a group of base connectors 3 that are provided on at least a surface 1a of the base 1 that is arranged to lie substantially flush with the given rack 2. The coupling mechanism 3, 4 also comprises at least a group of rack connectors 4 provided for the given rack 2 on a surface 2a of the given rack 2. The surface 2a of the given rack 2 is arranged to lie substantially flush with the surface 1a of the base 1 on which the base connectors 3 are provided. The rack connectors 4 substantially correspond with, and are configured to be coupled to, the base connectors 3, in the given connect mode of operation. The given rack 2 may be fitted with fixed rack connectors 4 or, alternatively, the given rack 2 may be retrofitted with detachable rack connectors 4, the latter configuration providing an advantage of compatibility of an embodiment of the present invention with conventional racks 2 in IT data centers. The group of base connectors 3 and/or the group of rack connectors 4 may be configured to be substantially detachably coupled to each other; which is generally illustrated by arrow 5 in FIG. 1 in which the base connectors 3 and the rack connectors 4 are shown to be detachably coupled to each other in a substantially lateral plane.

The base connectors 3 provided on the surface 1a of the base 1 facilitate substantial coupling of the base 1 with the given rack 2. A further feature of the base 1 is that the base 1 may be designed in order to support such a substantial coupling function. For example, shape and/or dimensions of the base 1 may be chosen in accordance with a spatial configuration of the given rack 2 and/or taking into account spatial constraints due to a multiplicity of racks on a given floor space.

As can be seen from FIG. 1, and in one embodiment, the base 1 is provided in a substantially U-shape. Such a shape of the base 1 is substantially compatible with a shape of a base of the given rack 2 so that the base 1 can be coupled and/or slotted with respect to the given rack 2 with relative ease. It order to facilitate ease of understanding, the base 1 shown in FIG. 1 is shown with a given number and equal distribution of base connectors 3 on a surface 1a thereof. However, an embodiment of the present invention is not limited to such a scenario, and at least one base connector of a number and/or distribution of the base connectors 3 may be chosen to facilitate a desired coupling between the base 1 and the given rack 2, while taking other aspects into consideration, such as, for example, the shape of the base of the given rack 2, and constraints that may be placed on the design of the base 1. Such constraints, for example, may include limiting the number of base connectors 3 provided on the base 1 and/or distributing the base connectors 3 on the base 1 to correspond with rack connectors 4 provided in a limited number and/or an irregular distribution on the rack 2.

The base connectors 3 may be provided as fixed from the outset or detachably with respect to the base 1. The base 1 may be provided as a substantially detachable unit that may be coupled to another equipment unit, at the base of other equipment unit, in one embodiment, which is in a vicinity of the given rack 2. In this way, cable connection for any given rack 2 may be established without a need to create space for the base 1 and/or rearrangement of existing equipment in the vicinity of the rack 2. Such features may serve to enhance the versatility, flexibility and/or ease of use of an embodiment of the present invention.

FIGS. 2a and 2b respectively illustrate a three-dimensional view of a connected mode and a disconnected mode of operation of a cable connection system 100, in accordance with embodiments of the present invention. As can be seen from FIGS. 2a and 2b, the base 1 and the given rack 2 are arranged such that respective surfaces 1a and 2a are arranged to lie substantially flush relative to each other. Viewing FIG. 2a in combination with FIG. 1, in a connected mode of operation, the base 1 is moved substantially laterally with respect to the given rack 2 such that the base connectors 3 on the surface 1a of the base 1 are coupled with the rack connectors 4 on the surface 2a (see FIG. 1) of the given rack 2. In a disconnected mode of operation, the base 1 is laterally decoupled from the given rack 2 as denoted by arrow 5 shown in FIG. 2b. Because the base connectors 3 and the rack connectors 4 are detachably coupled to each other, the base connectors 3 and the rack connectors 4 may be uncoupled with relative ease and without the need to provide specific resources to decouple the base connectors 3 and the rack connectors 4. FIGS. 2a and 2b also schematically illustrate a configuration of racks 2 that may typically be found in IT data centers. Any given rack 2 has multiple slots $2_0, 2_1, 2_2, 2_3, \ldots 2_n$. Each slot provides a space for storing at least a given network server which is securely screwed into place within the slot $2_0, 2_1, 2_2, 2_3, \ldots 2_n$.

Figure 3A:
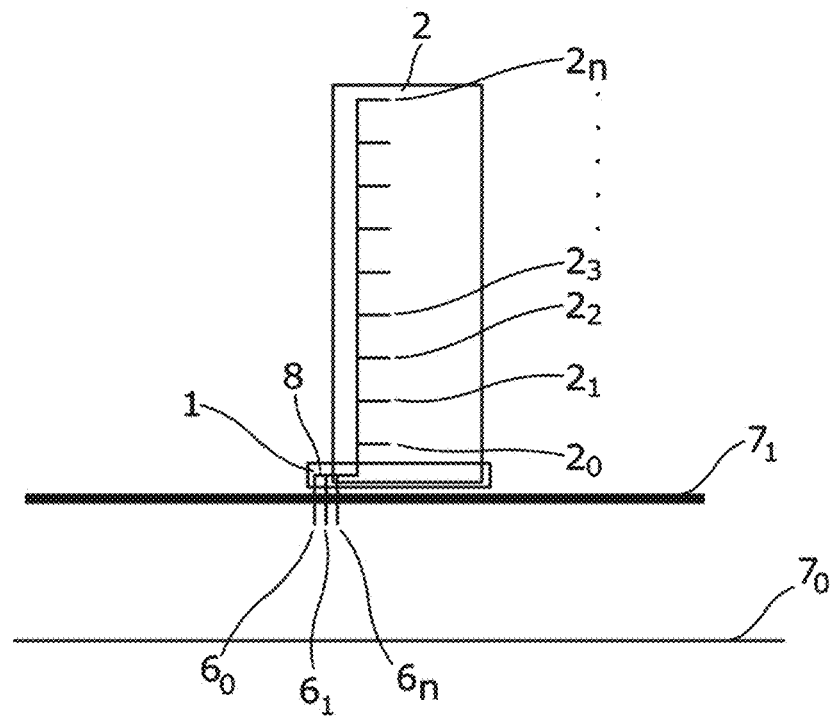
FIGS. 3a and 3b respectively correspond to FIGS. 2a and 2b and respectively illustrate a side-view of a connected mode and a disconnected mode of operation of a cable connection system, in accordance with embodiments of the present invention.
Figure 3B:
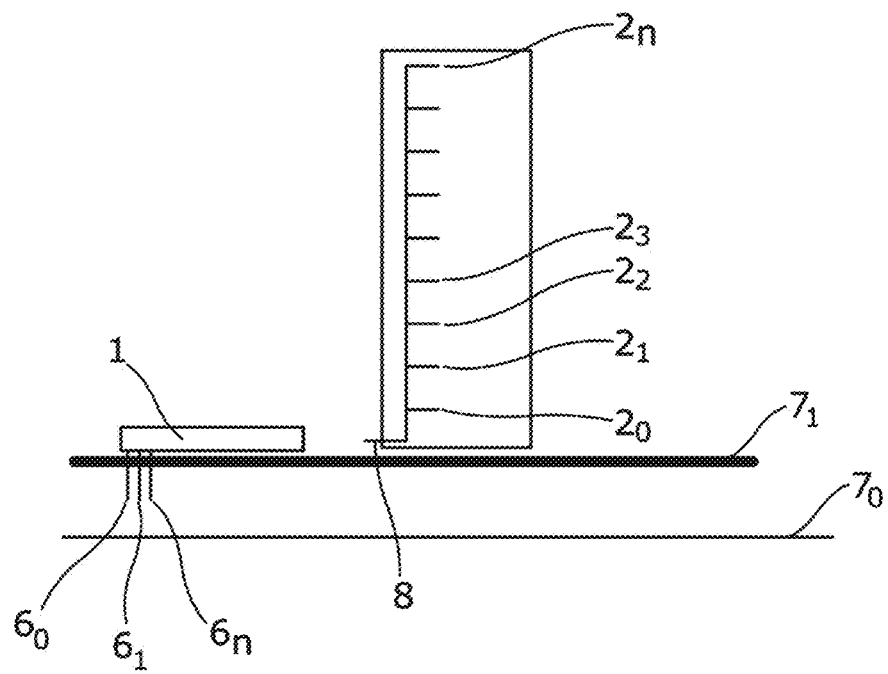

FIGS. 3a and 3b respectively correspond to FIGS. 2a and 2b and respectively illustrate side-view of a connected mode and a disconnected mode of operation of a cable connection system 100, in accordance with embodiments of the present invention.

As can be seen from both FIGS. 3a and 3b, the base 1 is configured to be coupled to any given cable $6_0, 6_1, \ldots 6_n$ that is to be connected with the given rack 2 and that is most provided, in one embodiment, in a raised floor configuration $7_1$ above a floor surface $7_0$ on which at least the base 1 and/or the given rack 2 is provided. In a connect mode of operation shown in FIG. 3a, and as explained previously with reference to FIG. 1, base connectors 3 that are provided for base 1 are configured to be coupled to rack connectors 4 that are provided for the given rack 2. When the base 1 is coupled to the given rack 2, the given cables $6_0, 6_1, \ldots 6_1$ are coupled to at least a line connection 8. The line connection 8 is coupled to any given slot $2_0, 2_1, 2_2, 2_3, \ldots 2_n$ of the given rack 2. Thus, connection of any given cable $6_0, 6_1, \ldots 6_n$ to any given slot $2_0, 2_1, 2_2, 2_3, \ldots 2_n$ of given rack 2 may be facilitated. In an embodiment of the present invention, and as previously mentioned, the given cables $6_0, 6_1, \ldots 6_n$ that are to be coupled to any given slot $2_0, 2_1, 2_2, 2_3, \ldots 2_n$ in the given rack 2 need not be limited to electrical cabling and may also be storage or network cabling. In this regard, the given cables $6_0, 6_1, \ldots 6_n$ may comprise copper or electrically conductive fiber.

Figure 4:
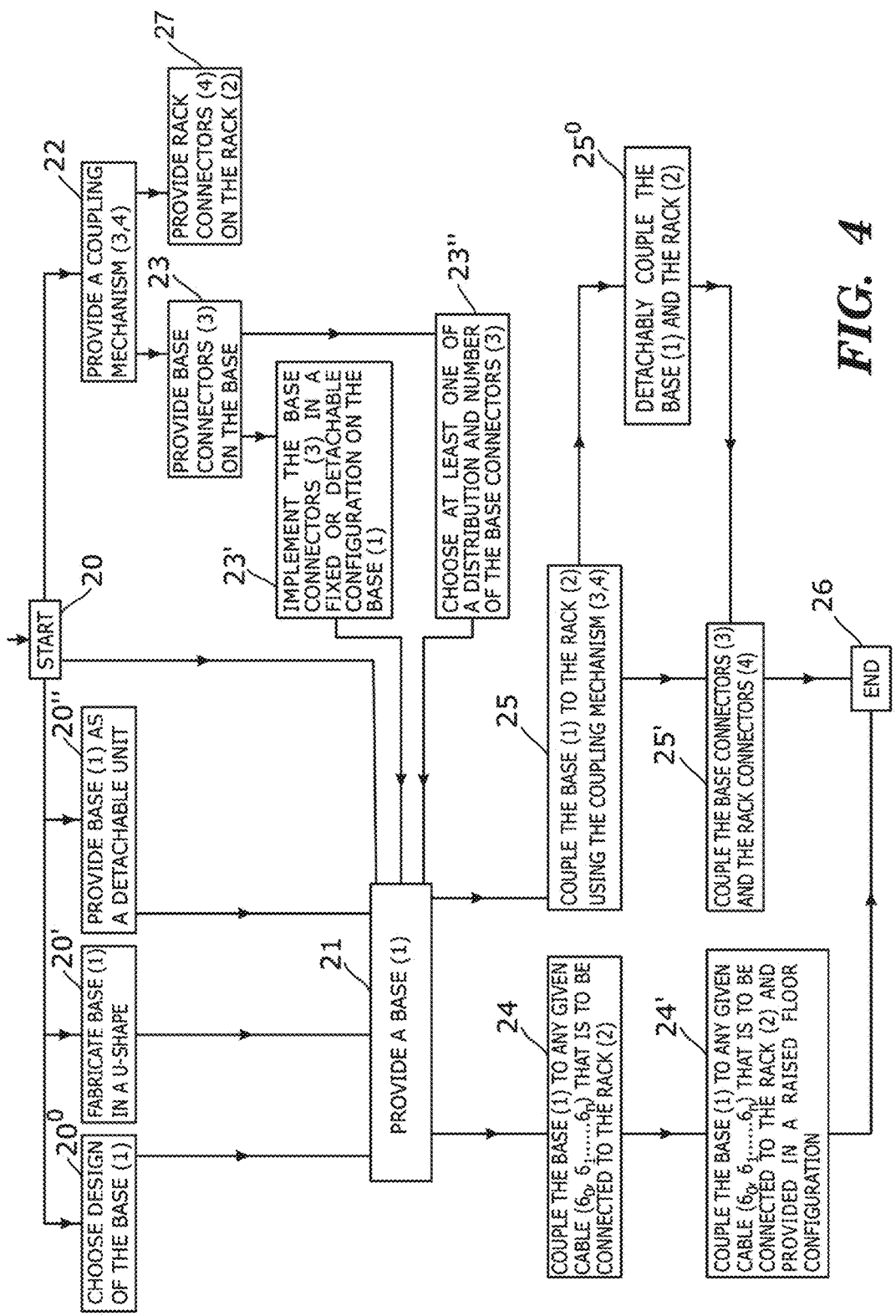
FIG. 4 is a flow chart of a method, in accordance with embodiments of the present invention.

FIG. 4 is a flow chart of a method, in accordance with embodiments of the present invention. The method of FIG. 4 facilitates cable connection to at least a given rack 2 comprising at least an electronic equipment unit provided in a stacked configuration.

The method of FIG. 4 starts at step 20 and proceeds to step 21 where at least a base 1 is provided. At step $20^0$, consideration may be given to at least a design of the base 1 to facilitate a substantial coupling of the base 1 with the given rack 2. A further consideration is what shape is to be provided for the base 1, which may be implemented at step 20' where, in one embodiment, the base 1 is fabricated in a substantially U-shape. A yet further consideration for the base 1 may be to provide the base 1 as a detachable unit which may be retrofitted onto an existing structure in a vicinity of the given rack 2, where a cable connection that may potentially be desired for connection to the given rack 2 is also accessible by the base 1, which is represented at step 20″.

Also following step 20, at least a coupling mechanism 3, 4 is provided at step 22. In respect of the provision of the coupling mechanism 3, 4, at least a group of base connectors 3 are provided on at least a surface 1a of the base 1. The surface 1a is arranged to lie substantially flush with the given rack 2 at step 23. As shown at step 23′, the base connectors 3 may be provided as substantially fixed or detachable with respect to the base 1. As shown at step 23″, a distribution and/or a number of the base connectors 3 is provided so as to facilitate a desired coupling between the base 1 and the given rack 2.

At step 27 following step 22, at least a group of rack connectors 4 are provided on at least a surface 2a of the rack 2.

At step 24 following step 21, the base 1 adapted with the base connectors 3 is configured to be coupled to any given cable $6_0, 6_1, \ldots 6_n$ that is to be connected with the given rack 2. In this respect, in a one embodiment of the present invention, at step 24′, the base 1 is coupled to any given cable $6_0, 6_1, \ldots 6_n$ that is to be connected with the given rack 2 and that is substantially provided in a raised floor configuration $7_1$ above a floor surface $7_0$ on which the base 1 and/or the given rack 2 is provided.

At step 25 following step 21, the base 1 is configured to be connected with the given rack 2 using the coupling mechanism 3, 4. In this regard, and as shown at step $25^0$, the base 1 and/or the given rack 2 are configured to be substantially detachably coupled from each other. In one embodiment of the present invention, and at step 25′, the base connectors 3 and the rack connectors 2 are coupled, and in this way, coupling between the base 1 and the given rack 2 is performed. Step 26 marks the end of any steps according to an embodiment of a method of the present invention.

Any one of steps $20^0$, 20′ and 20″ may precede step 21 in one embodiment, and are not performed in any given sequence. Steps $20^0$, 20′ and 20″ may be performed simultaneously in an embodiment of the present invention.

Steps 21 and 22 are performed after the start step 20, steps 23 and 24 are performed in relation to step 22, and steps 23′ and 23″ and steps 24 and 25 are not restricted to a given sequence of performance with respect to each other and may even be performed simultaneously.

Figure 5:
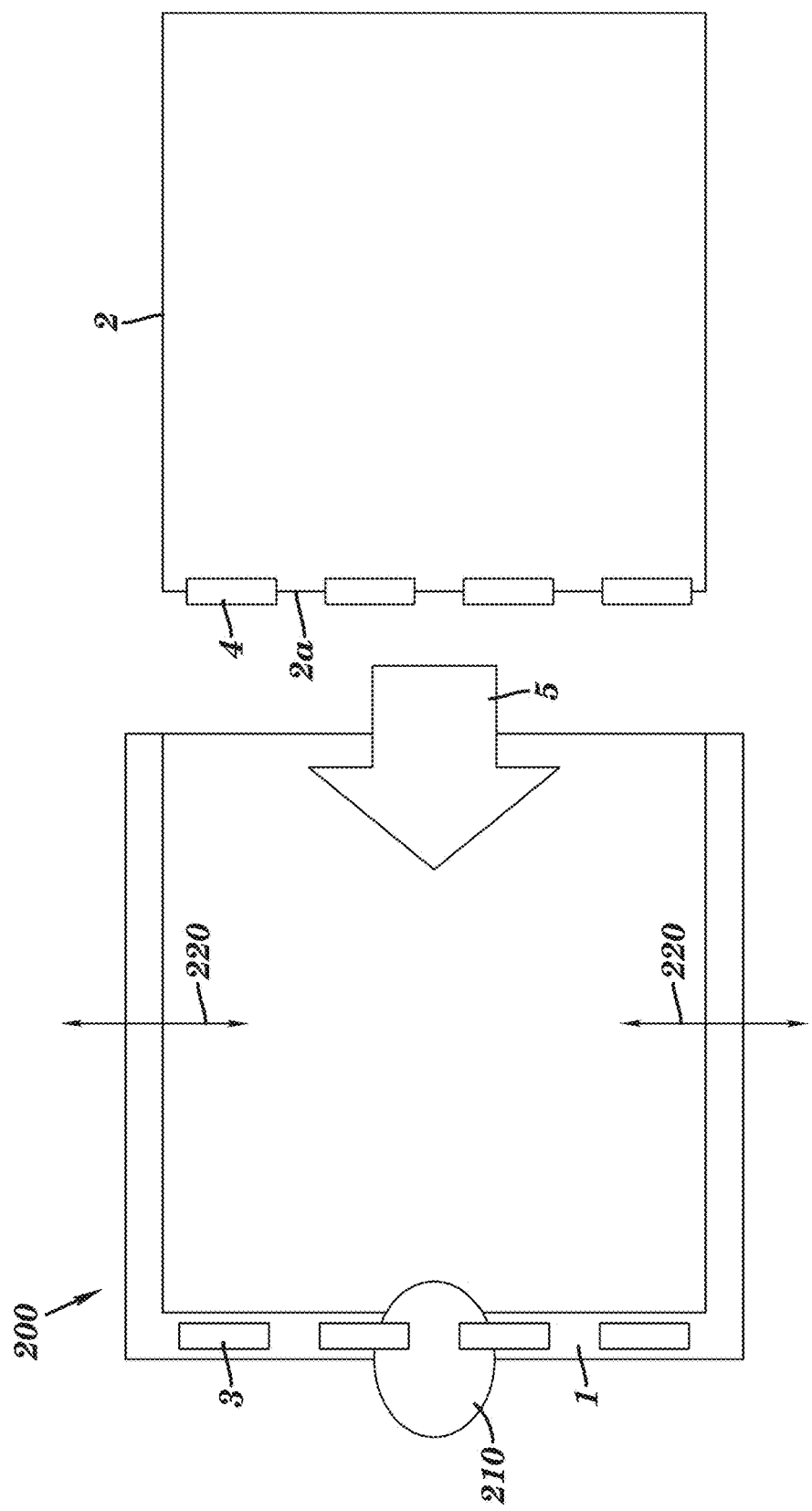
FIG. 5 illustrates a top view of a cable connection system which is the cable connection system of FIG. 1 with an added tube for enveloping cabling physically and electrically connected to the base and rack, in accordance with embodiments of the present invention.

FIG. 5 illustrates a top view of a cable connection system 200 which is the cable connection system 100 of FIG. 1 with an added tube 210 for enveloping electrical cabling physically and electrically connected to the base 1, in accordance with embodiments of the present invention. In one embodiment, the base 1 is a U-shaped connector (hereinafter, "U-connector") as depicted in FIG. 5. The width of the base 1 may be adjusted to be either increased or decreased in direction 220 as explained infra in conjunction with FIGS. 8a, 8b and 8c.

The tube 210 may be made of any material that can be shaped as a tube and remain intact during usage of the cable connection system 200. In one embodiment, the material of the tube 210 is both thermally and electrically insulative to protect against defects in the cabling (e.g., a break in the insulation surrounding the electrical wiring of the cabling) that may bring the electrical wiring of the cabling into electrical and/or thermal contact with the tube 210.

FIG. 6 illustrates the enveloped cabling 230 within the tube 210 of FIG. 5, in accordance with embodiments of the present invention. The cabling 230 is electrically connected to the base connectors 3 in the base 1 acrd passes through the tube 210.

The base 1 is at a fixed distance from the tube 210 (i.e., a fixed distance from a center axis 215 of the tube 210), which enables the base 1 to rotate around the tube 210 by rotating around the center axis 215 of the tube 210.

In one embodiment, the base 1 is mechanically coupled to the tube 210 by a rigid rod (not shown in FIG. 6) to keep the base 1 at the fixed distance from tube 210, which enables the base 1 to rotate around the tube 210 (i.e., to rotate around the center axis 215 of the tube 210) over an angular range encompassing from more than zero degrees to less than 360 degrees. Thus, the center axis 215, which perpendicular to the raised floor $7_1$, is the axis of rotation for the rotation of the base 1 around the tube 210.

In one embodiment, the raised floor $7_1$ has a circular track thereon (not shown in the Figures) and the tube 210 is positional at a radial center of the circular track. Further, the base is on, and can be moved along, the circular track, which keeps the base 1 at the fixed distance from tube 210.

As explained supra in conjunction with FIG. 1, the base 1 and rack 2 may be coupled together by the rack 2 being physically and electrically connected to the base 1 via the coupling mechanism of the base connectors 3 and the rack connectors 4. The coupling together of the base 1 and rack 2 may result from the rack 2 being moved toward the base 1 in the direction 5.

The base 1 and rack 2, when coupled together, are configured to rotate around the tube 210 (over an angular range encompassing from more than zero degrees to less than 360 degrees) in the plane of the raised floor $7_1$ which supports the base 1 and rack 2 above the floor surface $7_0$ (see FIGS. 3a and 3b). The cabling 230 extends beneath the raised floor $7_1$ from the tube 210 and is not below the floor surface $7_0$.

The rotation of the base 1 and rack 2, coupled together, around the tube 210 enables positioning the rack 2 in a 360 degree range of angular orientations relative to the tube 210 in, or parallel to, the plane of the raised floor $7_1$ and thus facilitates placing the rack 2 in an angular orientation that accommodates design considerations in a data center in which the rack 2 is located (e.g., for facilitating creation of hot and cold corridors in the data center).

FIG. 7 illustrates the tube 210 of FIG. 5 rotating in a circular pattern 251 around an axis of rotation 250 that is perpendicular to the raised floor in accordance with embodiments of the present invention. The circular pattern 251 of rotation of the tube 210 is in, or parallel to, the plane of the raised floor $7_1$.

The rotation of the tube 210 around the axis of rotation 250 in the circular pattern 251 is facilitated, in one embodiment, by enabling the raised floor $7_1$ to rotate around the axis of rotation 250 (over an angular range encompassing from more than zero degrees to less than 360 degrees) such that the tube 210 is at fixed location in the raised floor $7_1$. In this embodiment, the tube 210 and the raised floor $7_1$ rotate together around the axis of rotation 250.

In FIG. 7, the tube 210 is coupled to the base 1 as explained supra, so that the rack 2 coupled together with the base 1 enables the rack 2 and the base 1 to rotate in the circular pattern 251 around the axis of rotation 250 over an angular range encompassing from more than zero degrees to less than 360 degrees.

The rotation of the base 1 and rack 2, coupled together, around the axis of rotation 250 enables positioning the rack 2 in a 360 degree range of angular orientations relative to the axis of rotation 250 in, or parallel to, the plane of the raised floor 7₁ and thus facilitates placing the rack 2 in a spatial position that accommodates design considerations in a data center in which the rack 2 is located (e.g., for facilitating creation of hot and cold corridors in the data center).

Thus, movement of the rack 2 has two degrees of freedom: rotation of the rack 2 around the tube 210 as discussed supra in conjunction with FIG. 6; and rotation of the tube 210 around the axis of rotation 250 which causes rotation of the rack 2 around the axis of rotation 250 as discussed supra in conjunction with FIG. 7. Accordingly, the positioning of the rack 2 can be flexibly varied within the data center without having to remove or power off the cabling 230. In addition, the capability to flexibly position the rack 2 makes it easy to change airflow around the rack 2 and manage cold/hot corridors without having to remove or power off the cabling 230.

Figure 8A:
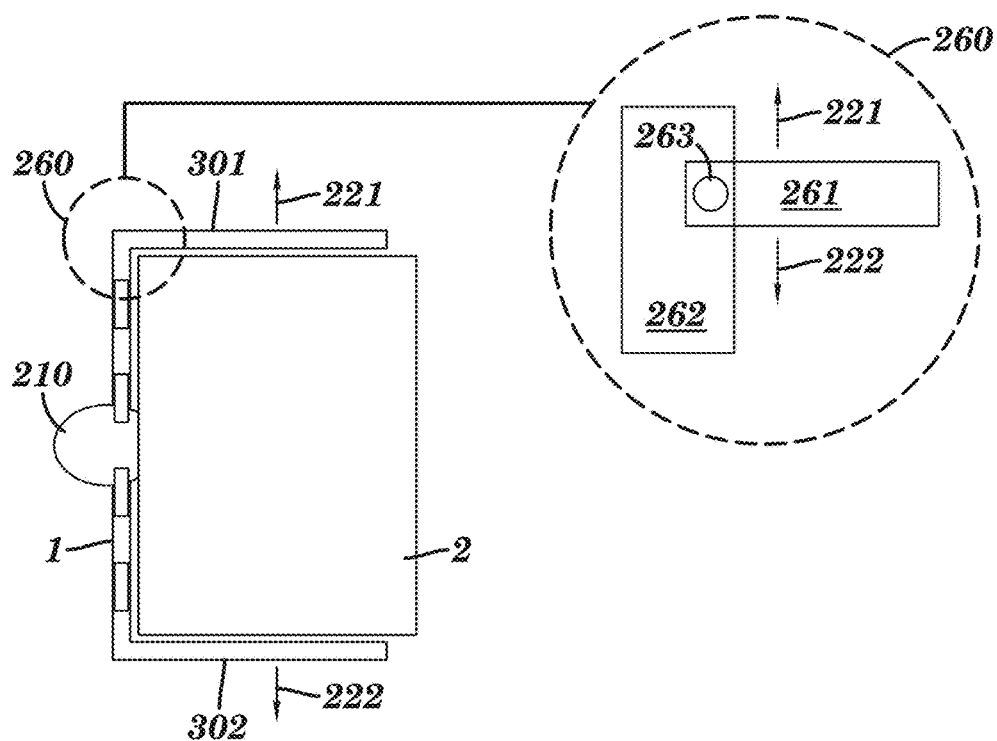
FIGS. 8a, 8b and 8c illustrate a device coupled to the base in FIG. 5 for adjusting the width of the base to the size of the rack, in accordance with embodiments of the present invention.
Figure 8B:
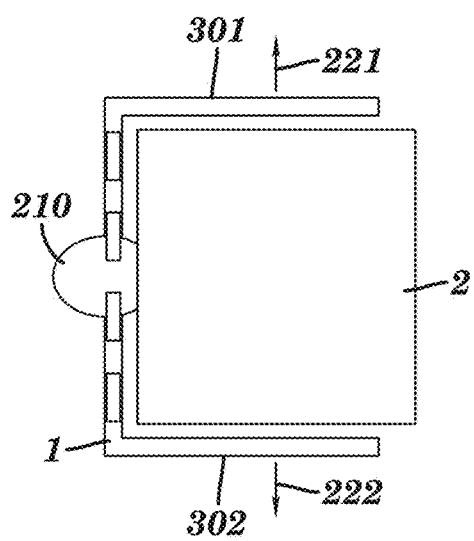
Figure 8C:
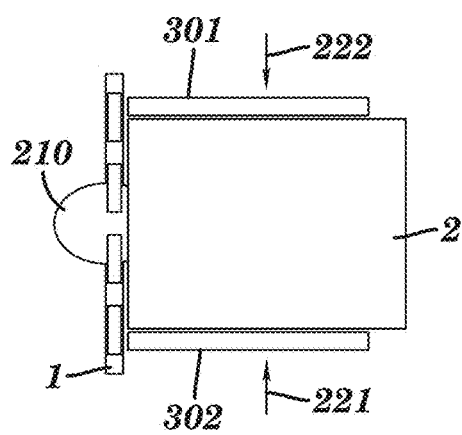

FIGS. 8a, 8b and 8c illustrate a device 260 coupled to the base 1 in FIG. 5 for adjusting the width of the base 1 to the size of the rack 2, in accordance with embodiments of the present invention. The width dimension is defined by upward direction 221 and downward direction 222. Thus, the width dimension is perpendicular to the raised floor 7₁. In FIGS. 8a, 8b and 8c, the base 1 is a U-connector having an upper arm 301 and a lower arm 302.

FIG. 8a depicts an embodiment of the device 260 as a rack and pinion system that includes a rack 261 and a pinion 262. For example, the rack 261 may be a circular gear and the pinion 262 may be a linear track with teeth 263 that engages the rack 261 to cause linear motion of the upper arm 301 and lower 302 in the directions 221 and 222, so as to increase (FIG. 8b) or decrease (FIG. 8c) the width of the base 1 to fit the size of the rack 2.

FIG. 8b depicts the upper arm 301 moving upward in the upward direction 221 and the lower arm 302 moving downward in the downward direction 222, which increases the width of the base 1 to fit the size of the rack 2.

FIG. 8c depicts the upper arm 301 moving downward in the downward direction 222 and the lower arm 302 moving upward in the upward direction 221, which decreases the width of the base 1 to fit the size of the rack 2.

The adjustable width of the base 1 enables the base 1 to be used with racks having different rack sizes and makes it easy to connect and disconnect different racks to the base 1.

The present invention has been described above purely by way of example and modifications of detail can be made within the scope of the present invention.

Each feature disclosed in the description may be provided independently or in any appropriate combination.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others or ordinary skill in the art to understand the embodiments disclosed herein.

What is claimed is:

1. A cable connection system, comprising:
a base;
a tube enveloping electrical cabling, said cabling electrically connected to base connectors of the base, said base configured to be physically and electrically connected to a rack, wherein the base is at a fixed distance from the tube and is configured to rotate around a center axis of the tube over an angular range encompassing from more than zero degrees to less than 360 degrees; and
the rack, wherein the rack is physically and electrically connected to the base, wherein the rack is detachable from the base, wherein the rack includes electronic equipment units, wherein rack connectors of the rack are electrically connected to one or more of the base connectors of the base, and wherein the rack and the base are configured to rotate together around the center axis of the tube over the angular range.

2. The cable connection system of claim 1, wherein the base and the rack are on a raised floor that is above a floor surface, and wherein the cabling extends beneath the raised floor from the tube and is not below the floor surface.

3. The cable connection system of claim 2, comprising a rod that keeps the base at a fixed distance from the tube, wherein the rack, base and rod are configured to rotate together in a circular pattern around an axis of rotation over the angular range, wherein the axis of rotation passes is perpendicular to the raised floor.

4. The cable connection system of claim 3, wherein the tube is at fixed location in the raised floor, and wherein the tube and the raised floor are configured to rotate together around the axis of rotation over the angular range.

5. The cable connection system of claim 1, wherein the base is mechanically coupled to the tube by a rigid rod, which keeps the base at the fixed distance from tube.

6. A cable connection system, comprising:
a base;
a tube enveloping electrical cabling, said cabling electrically connected to base connectors of the base, said base configured to be physically and electrically connected to a rack, wherein the base is at a fixed distance from the tube and is configured to rotate around a center axis of the tube over an angular range encompassing from more than zero degrees to less than 360 degrees; and
a device coupled to the base, wherein the device is configured to adjust a width of the base to fit a size of the rack, and wherein the device comprises a rack and pinion system configured to adjust the width of the base to fit the size of the rack.

7. The cable connection system of claim 6, wherein the base is U-connector having an upper arm and a lower arm, wherein the device is configured to adjust the width of the base to either increase by moving the upper and lower arms further apart or decrease by moving the upper and lower arms closer together.

* * * * *